United States Patent [19]
Beitman

[11] Patent Number: 5,395,789
[45] Date of Patent: Mar. 7, 1995

[54] INTEGRATED CIRCUIT WITH SELF-ALIGNED ISOLATION

[75] Inventor: Bruce A. Beitman, Allentown, Pa.

[73] Assignee: AT&T Corp., Murray Hill, N.J.

[21] Appl. No.: 102,870

[22] Filed: Aug. 6, 1993

[51] Int. Cl.[6] .................................... H04L 21/76
[52] U.S. Cl. .................................... 437/67; 437/62; 437/63; 437/974; 148/DIG. 50; 148/DIG. 12
[58] Field of Search ............... 437/62, 63, 67, 974; 148/DIG. 50, DIG. 12

[56] References Cited

U.S. PATENT DOCUMENTS

| | | | |
|---|---|---|---|
| 4,307,180 | 12/1981 | Pogge | 437/67 |
| 4,794,445 | 12/1988 | Homma et al. | 357/71 |
| 4,952,524 | 8/1990 | Lee et al. | 437/67 |
| 5,077,234 | 12/1991 | Scoopo et al. | 148/DIG. 50 |
| 5,098,861 | 3/1992 | Blackstone | 437/974 |
| 5,102,821 | 4/1992 | Moslehi | 437/62 |

FOREIGN PATENT DOCUMENTS 0259546 10/1989 Japan ........................ 437/62

OTHER PUBLICATIONS

Semiconductor International pp. 72–74, "AT&T's Bipolar Process Is Best", K. G. Moerschei, T. Y. Chiu, et al. (Bipolar Series: Part 1).

*Primary Examiner*—Brian E. Hearn
*Assistant Examiner*—Trung Dang
*Attorney, Agent, or Firm*—Richard D. Laumann

[57] ABSTRACT

Integrated circuits are fabricated on a bonded wafer which has a buried silicide layer.

6 Claims, 2 Drawing Sheets

INTEGRATED CIRCUIT WITH SELF-ALIGNED ISOLATION

TECHNICAL FIELD

This invention relates generally to integrated circuits with self-aligned deposited field oxides and to such circuits fabricated with bonded wafers.

BACKGROUND OF THE INVENTION

Although most silicon integrated circuits presently use metal oxide semiconductor(MOS) field effect transistors, there are many integrated circuits made that use bipolar transistors. In particular, bipolar technologies have been developed with polysilicon emitters to minimize diffusion and reduce emitter to base capacitance, special oxidation steps to minimize the base capacitance, smaller geometries to reduce parasitic capacitance, and bonded SOI (Silicon on Insulator) wafers to minimize the collector to substrate capacitance. All of these developments fundamentally are directed toward increasing the operational speed of the bipolar device.

In order to minimize the parasitic collector resistance, a heavily doped buried layer is implanted into the silicon wafer prior to epitaxial growth. The subsequent epitaxial layer is typically doped for the intrinsic collector region and is used to form the base and emitter regions. The combination of the buffed layer and the initial silicon wafer impurity concentration determine two fundamental parasitics: the collector resistance and the collector to substrate capacitance. To minimize collector capacitance, a lightly doped substrate is required. A secondary parasitic device, namely an SCR device, is formed by multiple closely spaced transistors and leads to latch-up. This device limits the spacing between transistors. Therefore, opposing parasitics create fundamental limitation of the bipolar transistor technologies.

These basic limitations, and the elimination of latch-up, are realized with the use of bonded SOI wafers in which the individual transistor can be totally isolated by a dielectric. This is typically achieved by use of a buried oxide wafer with a refilled trench surrounding each active device.

The most common method of trench isolation, for bipolar technologies, is to etch a "moat" through the silicon to the burled oxide, oxidize the remaining silicon, deposit a thick layer of polysilicon and finally polish away the excess polysilicon from over the active area regions. This method is used because of the silicon thickness necessary to accommodate the desired 5 $\mu$m heavily doped buffed layer. In CMOS technologies, where the burled layer is not utilized, it is possible to create the trench region by use of LOCOS or SWAMI field oxide methods. LOCOS and SWAMI are well known acronyms. See, for example, *Semiconductor International*, pp. 72-74, November 1991, for a description of an exemplary bipolar fabrication method.

SUMMARY OF THE INVENTION

According to an exemplary embodiment of the invention, integrated circuits are manufactured by a process which forms layers of oxide and polysilicon on the semiconductor surface of a substrate having buried oxide and silicide layers; patterns in a first step to form isolation regions in said semiconductor; patterns in a second step to form trenches which expose portions of said oxide layer; deposits an oxide in said isolation regions and said trenches; and completes said integrated circuit fabrication. The oxide and polysilicon layers are closer to the silicide layer than to the buried oxide layer. More generally, any easily removed material may be deposited on the oxide; polysilicon is easily removed but silicon nitrite can also be used. In a preferred embodiment, the oxide and polysilicon remaining after said second patterning step are removed. In another preferred embodiment, the bonded wafer is formed by forming silicide and oxide layers on first and second wafers, respectively; and bonding said first and second wafers together so that said oxide and silicide layers are adjacent. It is desirable to thin the bonded wafer on the silicide layer side. The self-aligned process may be implemented without the buried oxide and silicide layers.

For reasons of clarity, the elements depicted are not drawn to scale.

DETAILED DESCRIPTION

The invention will be described by reference to an exemplary embodiment. Variations of this embodiment as well as other embodiments will be apparent to those skilled in the art.

Figure 1:
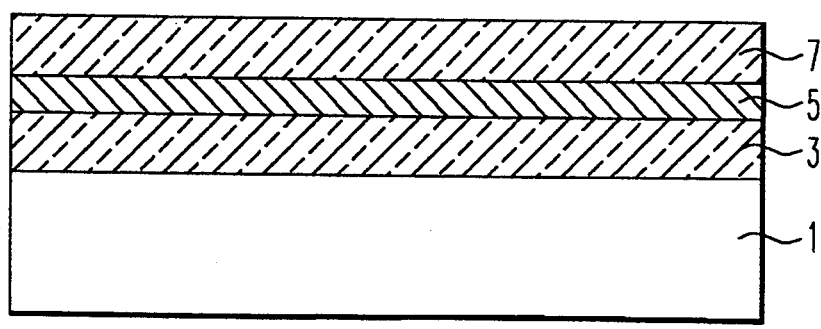
FIGS. 1-5 are sectional views of an integrated circuit at different stages of fabrication according to this invention.

FIG. 1 depicts a structure having silicon substrate 1, buried oxide layer 3, metal silicide layer 5, and silicon layer 7 having a first conductivity type. An exemplary metal for silicide layer 5 is tungsten and, in a preferred embodiment, n— is the first conductivity type.

An exemplary method for fabricating the structure will be briefly described. A wafer, which will be the device wafer, is ion implanted with antimony. Appropriate doses and energies will be selected by those skilled in the art. Typically, the implanted layer is shallow and has an imparity concentration of approximately $10^{17}$/cm$^2$. A metallic silicide layer is formed using known techniques. A typical metal for forming silicides is tungsten due to the good characteristics of tungsten silicide. Another wafer, termed the handle wafer, is prepared which has an oxide layer. The oxide is typically several microns thick. The oxide may be a deposited oxide such as TEOS.

The two wafers are now bonded together with the oxide and silicide layers being adjacent to each other. Conventional bonding techniques may be used. The device wafer is now thinned until it is several microns thick. The structure depicted in FIG. 1 is the result. Known techniques may be used.

Figure 2:
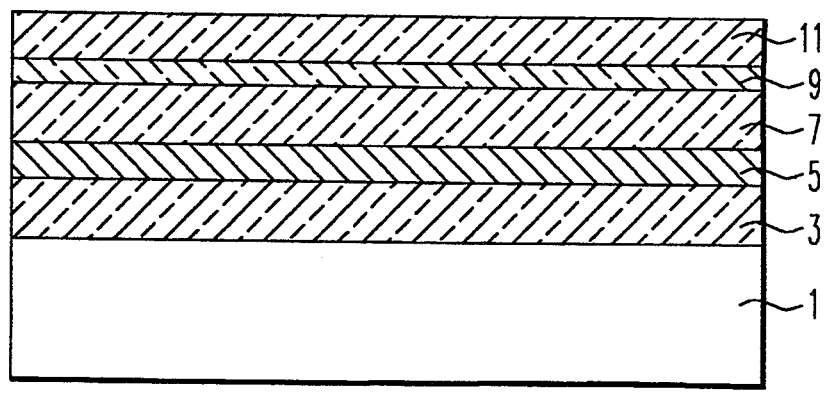

An oxide layer 9 is now formed on layer 7 and a layer 11 of polysilicon is deposited on the oxide layer 9. The oxide layer 9 is relatively thin, typically 35 nm, and the polysilicon layer 11 is thicker, typically 400 nm. A grown oxide may be used. Materials other than polysilicon may be used. For example, silicon nitride may be used. The material should be easily removed. Known techniques may be used to deposit the polysilicon layer. The resulting structure is depicted in FIG. 2.

Figure 3:
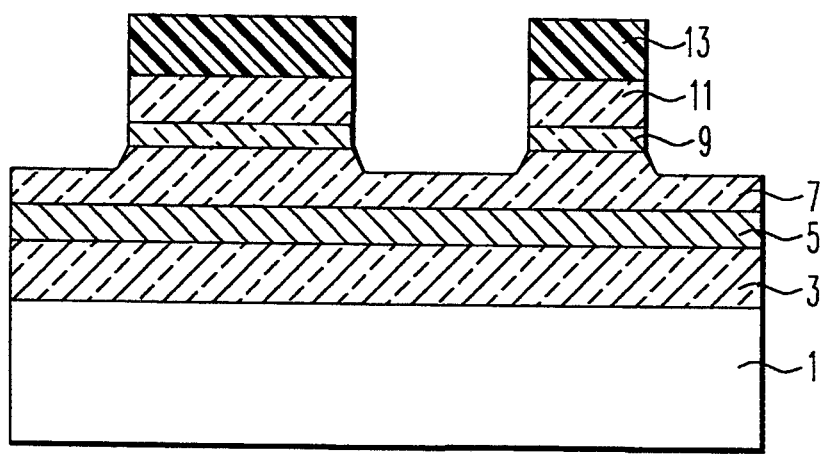
Figure 4:
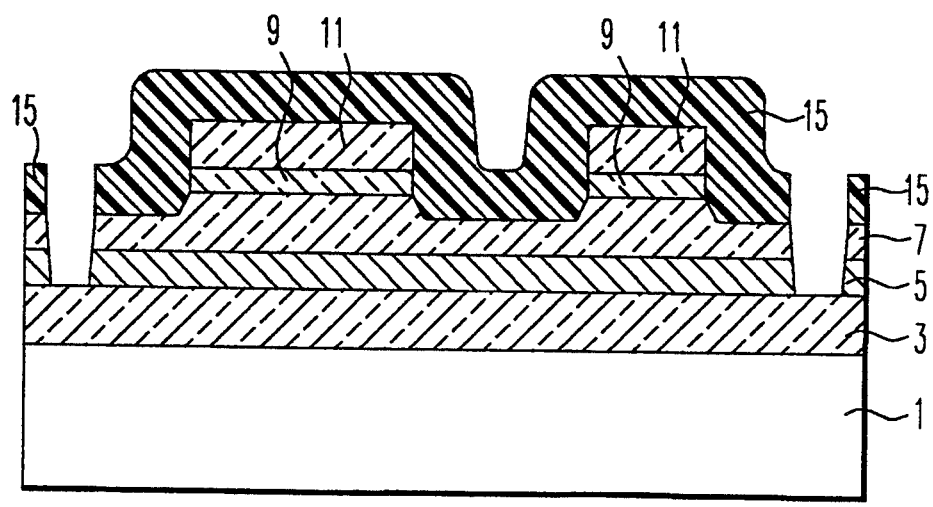

Two lithographic patterning steps are now performed. A photoresist layer 13 is deposited and patterned to delineate isolation regions which extend through oxide layers 9 and polysilicon layer 11 into layer 7. Conventional lithographic patterning techniques are used. In the first patterning step, the pattern is transferred through the photoresist and into layer 7 as shown in FIG. 3. That is, the isolation regions are formed in layer 7. In the second patterning step, another layer 15 of photoresist is deposited and patterned to delineate trenches. The pattern is transferred through layer 7 to the oxide layer 3 of the bonded wafer. The resulting structure is shown in FIG. 4.

Figure 5:
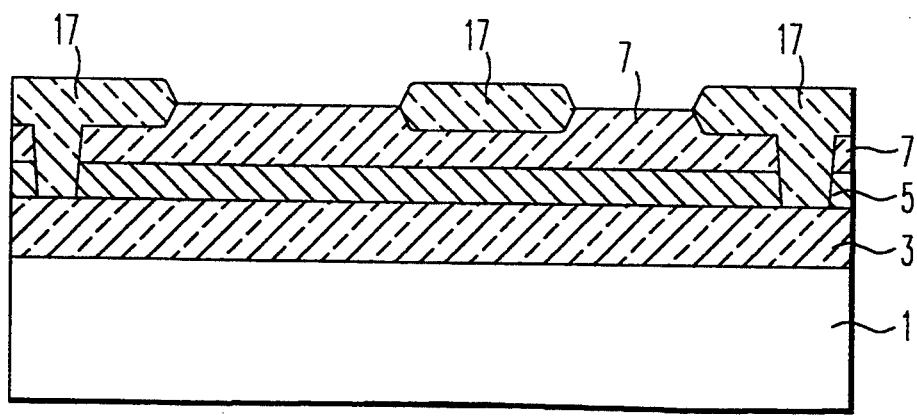

A layer 17 of an oxide, such as TEOS, is now deposited. A dielectric planarization technique is now used to provide a planar surface. For example, a layer of photoresist may be deposited and a planarizing etchback, that is, an etch that removes dielectric and photoresist at approximately the same rate, is used. Materials other than a photoresist may be used. Well-known etching techniques are used to remove the now exposed polysilicon and oxide layers to produce the structure depicted in FIG. 5.

Conventional fabrication techniques are used to complete the fabrication of the integrated. For example, techniques such as those described in *Semiconductor International,* pp 72–74, November 1991 may be used to complete fabrication of bipolar devices. This technique will be understood by those skilled in the art and further description is not required. Of course, other fabrication techniques may be used.

It will be appreciated that the described method reduces parasitic capacitance and resistance and also reduces collector capacitance and resistance. It will also be appreciated that the deposited field oxide is self aligned to the active area and may be used for either MOS or bipolar devices or for both. If only a self-aligned field oxide is desired, the buried oxide and silicide layers may be omitted.

Variations in the embodiment described will be apparent to those skilled in the art.

I claim:

1. A method of integrated circuit manufacture comprising the steps of:

forming layers of oxide and a material on a substrate, said substrate having a semiconductor surface and buried oxide and silicide layers, said layers of oxide and material on the semiconductor surface and being closer to said silicide layer than to said buried oxide layer;

first patterning to form isolation regions in said semiconductor;

second patterning to form trenches which expose portions of said oxide layer;

depositing an oxide in said isolation regions and in said trenches; and completing said integrated circuit fabrication.

2. A method as recited in claim 1 in which said material comprises polysilicon.

3. A method as recited in claim 2 comprising the further step of: removing said oxide and polysilicon remaining after said second patterning step.

4. A method as recited in claim 3 comprising fabricating said substrate by the further steps of:

forming a silicide layer on a first wafer;

forming an oxide layer on a second wafer;

bonding said first and second wafers together to form a bonded wafer with said oxide and silicide layers being adjacent to each other.

5. A method as recited in claim 4 comprising the further step of: thinning said bonded wafer on the side of said silicide layer.

6. A method as recited in claim 1 in which said material is silicon nitride.

* * * * *